(12) United States Patent
Kurata (10) Patent No.: US 7,666,745 B2
(45) Date of Patent: Feb. 23, 2010

(54) METHOD OF MANUFACTURING A SEMICONDUCTOR DEVICE AND A SEMICONDUCTOR DEVICE

(75) Inventor: Hajime Kurata, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 73 days.

(21) Appl. No.: 12/054,684

(22) Filed: Mar. 25, 2008

(65) Prior Publication Data

US 2008/0237739 A1 Oct. 2, 2008

(30) Foreign Application Priority Data

Mar. 26, 2007 (JP) ............................. 2007-080159

(51) Int. Cl.
*H01L 21/336* (2006.01)
(52) U.S. Cl. ...................... 438/286; 438/179; 438/233; 257/E21.619; 257/E21.427
(58) Field of Classification Search ................ 438/179, 438/233, 286; 257/E21.619, E21.427
See application file for complete search history.

(56) References Cited

U.S. PATENT DOCUMENTS

| 5,672,531 A * | 9/1997 | Gardner et al. ............... 438/286 |
| 5,923,982 A * | 7/1999 | Kadosh et al. ............... 438/286 |
| 2006/0043415 A1* | 3/2006 | Okamoto et al. ............ 257/192 |

FOREIGN PATENT DOCUMENTS

JP 11-186543 A 7/2009

* cited by examiner

*Primary Examiner*—Matthew Smith
*Assistant Examiner*—John M Parker
(74) *Attorney, Agent, or Firm*—Westerman, Hattori, Daniels & Adrian, LLP (57) ABSTRACT

A method of manufacturing a semiconductor device, has forming a gate insulating film over a surface of a substrate, eliminating a portion of the gate insulating film in a region, forming a gate electrode over the gate insulating film and a drain electrode on the region, implanting first impurities into the substrate using the gate electrode and the drain electrode as a mask, forming an insulating film to fill the space between the gate electrode and the drain electrode, and implanting second impurities into the substrate to form a source region using the gate electrode, the drain electrode and the insulating film as a mask.

7 Claims, 6 Drawing Sheets

METHOD OF MANUFACTURING A SEMICONDUCTOR DEVICE AND A SEMICONDUCTOR DEVICE

TECHNICAL FIELD

This technical field relates to a method of manufacturing a high breakdown-voltage semiconductor device and a structure of a high breakdown-voltage semiconductor device.

BACKGROUND

High breakdown-voltage semiconductor devices are expected to have excellent radio-frequency characteristics and high breakdown voltage of source/drain regions.

In such a high breakdown-voltage semiconductor device, when a voltage higher than a certain level is applied to a drain region, a large electric field occurs at the boundary between the drain region and a channel region, and junction breakdown occurs at the boundary. Therefore, a problem in increasing breakdown voltage is how to reduce an electric field produced at the boundary between the drain region and the channel region.

SUMMARY

A method of manufacturing a semiconductor device, has forming a gate insulating film over a surface of a substrate, eliminating a portion of the gate insulating film in a region, forming a gate electrode over the gate insulating film and a drain electrode on the region, implanting first impurities into the substrate using the gate electrode and the drain electrode as a mask, forming an insulating film to fill the space between the gate electrode and the drain electrode, and implanting second impurities into the substrate to form a source region using the gate electrode, the drain electrode and the insulating film as a mask.

DESCRIPTION OF THE PREFERRED EMBODIMENTS

A method of manufacturing a high breakdown-voltage semiconductor device and a structure of a high breakdown-voltage semiconductor device are described with reference to embodiments. However, the following embodiments are not limited to these embodiments.

First Embodiment

An n-type high breakdown-voltage semiconductor device and a method of manufacturing an n-type high breakdown-voltage semiconductor device according to a first embodiment are described in detail with reference to FIGS. 1A and 1B. The semiconductor device and the method of manufacturing the semiconductor device according to the first embodiment are characterized in that a LDD region is formed in a self alignment manner with a gate electrode and a drain electrode.

Figure 1A:
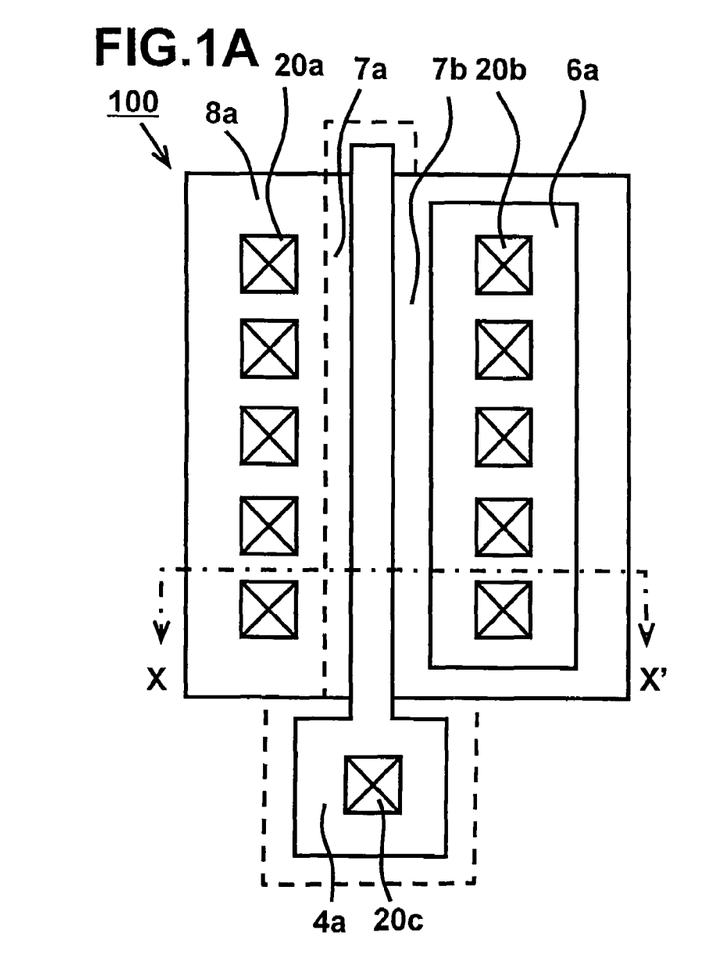
FIG. 1A is a plan view of a high breakdown-voltage semiconductor device according to a first embodiment.
Figure 1B:
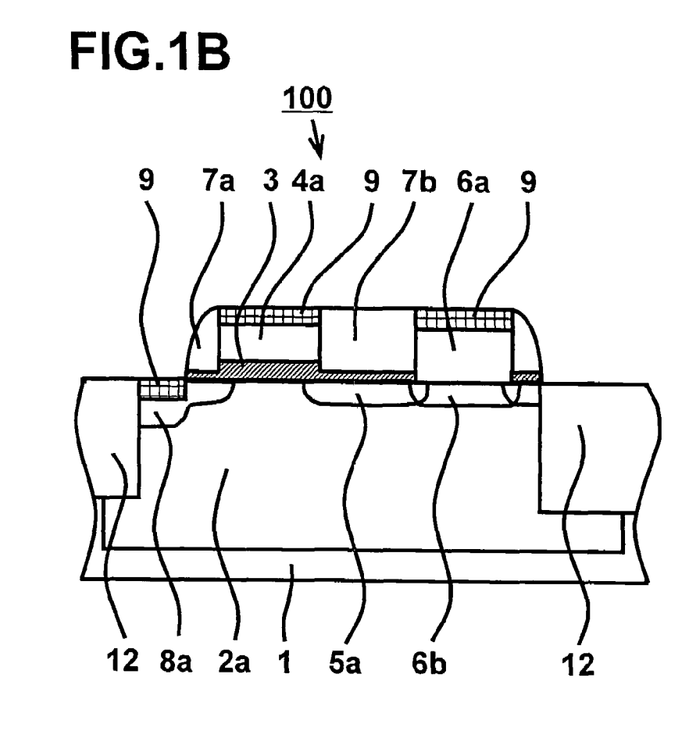
FIG. 1B is a schematic sectional view of a principal portion of the high breakdown-voltage semiconductor device according to the first embodiment.

FIGS. 1A and 1B are drawings each showing a principal portion of a semiconductor device according to the first embodiment.

FIG. 1A is a plan view of a high breakdown-voltage semiconductor device according to the first embodiment. FIG. 1A shows a high breakdown-voltage semiconductor device 100 including a gate electrode 4a, a drain electrode 6a, an insulating film 7a constituting a first sidewall spacer, an insulating film 7b constituting a second sidewall spacer, a source region 8a, contact plugs 20a for connecting wiring to the source region, contact plugs 20b for connecting wiring to the drain region, and a contact plug 20c for connecting wiring to the gate electrode 4a. Also, a silicide layer 9 and an interlayer insulating film are formed on the surfaces of the gate electrode 4a, the drain electrode 6a, and the source region 8a.

The gate electrode 4a, the drain electrode 6a, and the source region 8a are formed by implanting a high concentration of conductive impurities into silicon. Specifically, phosphorus ions are implanted into the gate electrode 4a, the drain electrode 6a, and the source region 8a at a phosphorus concentration of, for example, $5.0 \times 10^{20}$ cm$^{-3}$. The insulating film 7a constituting the first sidewall spacer and the insulating film 7b constituting the second sidewall spacer are insulative and are composed of, for example, silicon oxide. The contact plugs 20a for connecting wiring to the source region 8a, the contact plugs 20b for connecting wiring to the drain electrode 6a, and the contact plug 20c for connecting wiring to the gate electrode 4a are composed of tungsten and are electrically connected to the source region 8a, the drain electrode 6a, and the gate electrode 4a, respectively.

As shown in FIG. 1A, the drain electrode 6a is formed on one of the sides of the gate electrode 4a on a substrate. The source region 8a is formed on the other side of the gate electrode 4a within the substrate. The insulating film 7a constituting the first sidewall spacer and the insulating film 7b constituting the second sidewall spacer are formed around the gate electrode 4a and the drain electrode 6a. Further, an element separation region 12 is formed around the high breakdown-voltage semiconductor device 100.

FIG. 1B is a schematic sectional view showing a principal portion of a first example of the high breakdown-voltage semiconductor device according to the first embodiment. FIG. 1B is a sectional view of the high breakdown-voltage semiconductor device 100, taken along line X-X' in FIG. 1A. The high breakdown-voltage semiconductor device 100 includes a p-type silicon substrate 1, a p-type well region 2a, a gate insulating film 3, the gate electrode 4a, a n-type drain region 5a, the drain electrode 6a, the insulating film 7a constituting the first sidewall spacer, the insulating film 7b constituting the second sidewall spacer, the n-type source region 8a, the cobalt silicide layer 9, and the element separation region 12. In FIG. 1B, the completely same components as in FIG. 1A are denoted by the same reference numerals.

The substrate 1 is a p-type silicon substrate having a p-type impurity concentration of, for example, $1.0 \times 10^{15}$ cm$^{-3}$. The element separation region 12 has a shallow trench isolation structure. The p-type well region 2a is formed by implanting boron ions into the substrate 1. The p-type well region 2a has a boron concentration of, for example, $1.0 \times 10^{16}$ cm$^{-3}$ and a depth of 350 nm. The gate insulating film 3 is composed of silicon oxide and formed over the substrate 1. The thickness of the gate insulating film 3 is, for example, 6 nm. The gate electrode 4a is formed over the surface of the gate insulating film 3, and the drain region 5a is formed on one of the sides of the gate electrode 4a within the substrate 1. The drain region 5a is doped with phosphorus ions implanted as n-type conductive impurities at a low concentration. A region in which a low concentration of conductive impurities is diffused is referred to as a "Lightly Doped Drain (LDD) region". The drain region 5a has a phosphorus concentration of $1.0 \times 10^{19}$ cm$^{-3}$ and a depth of 50 nm. The drain electrode 6a is connected to the drain region 5a and an impurity diffusion layer 6b is formed by inwardly diffusing first impurities or second impurities, which are implanted into the drain electrode 6a, from the surface of the substrate 1. The insulating film 7a constituting the first sidewall spacer is formed on the source region-side sidewall of the gate electrode 4a. The insulating film 7b constituting the second sidewall spacer is formed on the drain-side sidewall of the gate electrode 4a to fill the space between the drain electrode 6a and the gate electrode 4a. The source region 8a is formed on the other side of the gate electrode 4a within the substrate 1. The silicide layer 9 is composed of low-resistance phase cobalt silicide. The silicide layer 9 is formed on the surfaces of the source region 8a, the gate electrode 4a, and the drain electrode 6a.

A process for manufacturing the high breakdown-voltage semiconductor device according to the first embodiment is described with reference to FIGS. 2A to 2D, 3A to 3D, and 4A to 4C.

Figure 2A:
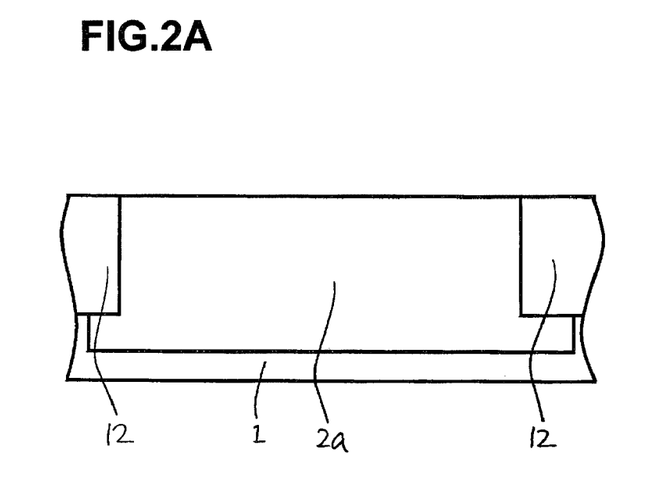
FIGS. 2A to 2D are schematic sectional views each showing a principal portion in a step for manufacturing the high breakdown-voltage semiconductor device according to the first embodiment.

FIG. 2A is a schematic sectional view of a principal portion in the step of preparing the substrate. FIG. 2A shows the substrate 1, the p-type well region 2a, and the element separation region 12. The substrate 1 is a p-type silicon substrate having a p-type impurity concentration of, for example, $1.0 \times 10^{15}$ cm$^{-3}$. The element separation region 12 has a shallow trench isolation structure and is formed by implanting boron ions into the substrate 1. The p-type well region 2a has a boron concentration of, for example, $1.0 \times 10^{16}$ cm$^{-3}$ and a depth of 350 nm.

Figure 2B:
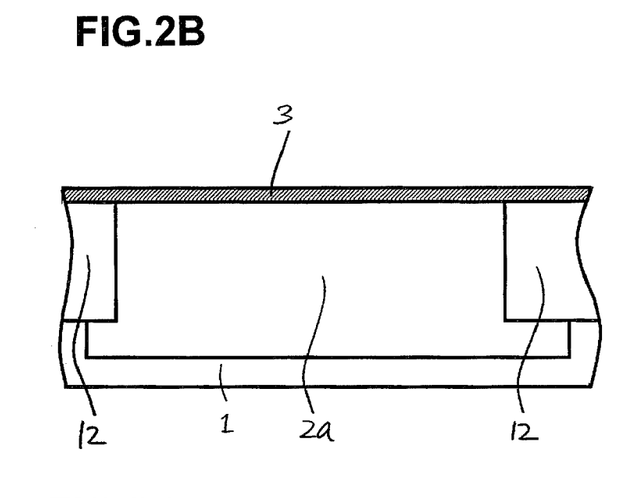

FIG. 2B is a schematic sectional view showing the principal portion in the step of forming the gate insulating film 3 over the surface of the substrate. FIG. 2B shows the gate insulating film 3 in addition to FIG. 2A. The gate insulating film 3 is composed of silicon oxide.

As shown in FIG. 2B, the surface of the substrate 1 is thermally oxidized to form the gate insulating film 3 having a thickness of, for example, 6 nm on the surface of the substrate 1.

Figure 2C:
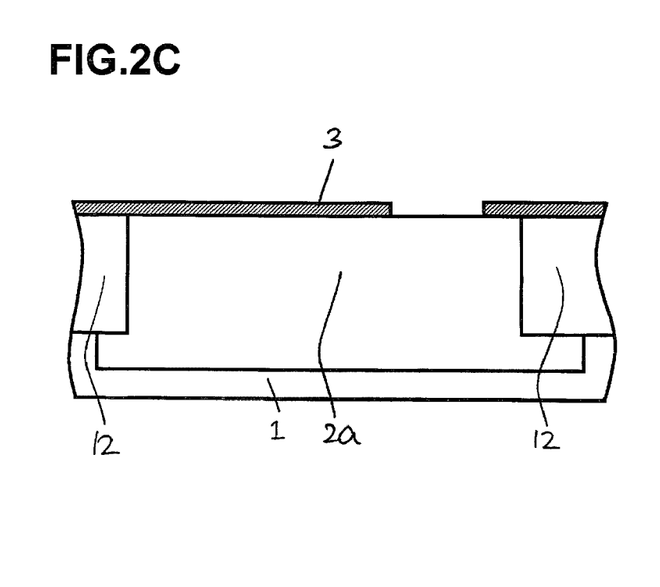

FIG. 2C is an enlarged sectional view showing the principal portion in the step of eliminating (etching out) a portion with a width of about 300 nm from the gate insulating film 3 in a region where the drain electrode is to be formed.

Figure 2D:
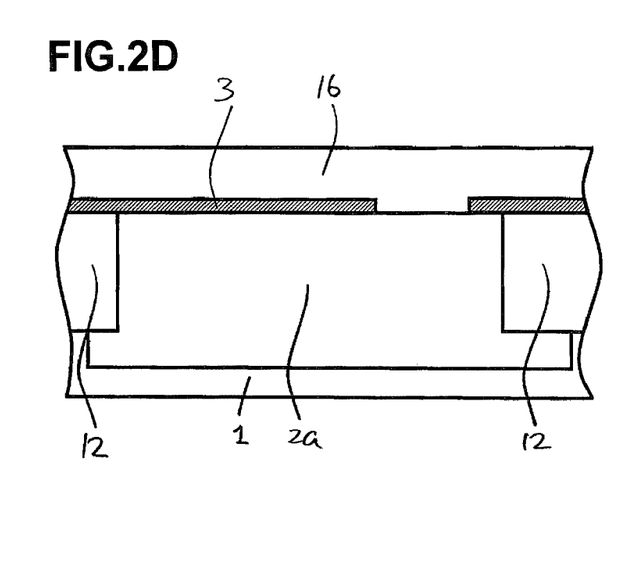

FIG. 2D is an enlarged sectional view showing the principal portion in the step of depositing polysilicon 16 over the surfaces of the substrate 1 and the gate insulating film 3. FIG. 2D shows the polysilicon 16 in addition to FIG. 2C.

Figure 3A:
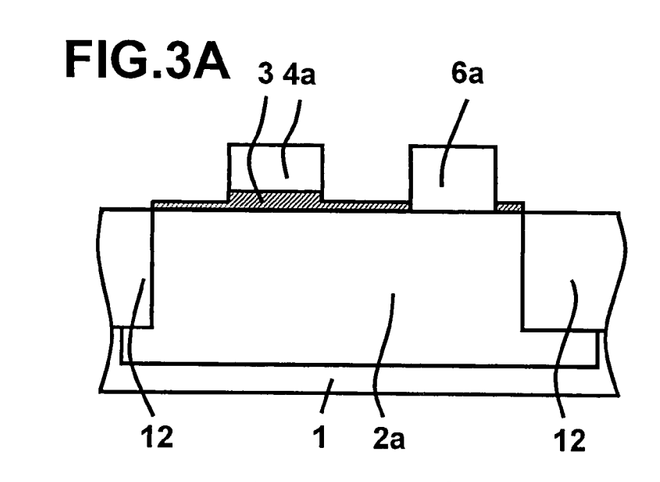
FIGS. 3A to 3D are schematic sectional views each showing a principal portion in a step for manufacturing the high breakdown-voltage semiconductor device according to the first embodiment.

FIG. 3A is an enlarged schematic view showing the principal portion in the step of simultaneously forming the gate electrode over the gate insulating film and the drain electrode on the drain region with a space therebetween. FIG. 3A shows the gate electrode 4a and the drain electrode 6a in addition to FIG. 2D. The width of each of the gate electrode 4a and the drain electrode 6a is 300 nm.

As shown in FIG. 3A, the polysilicon 16 is patterned by photolithography to form the gate electrode 4a and the drain electrode 6a. The distance between the gate electrode 4a and the drain electrode 6a is preferably, for example, 0.2 μm to 0.3 μm. This is because the insulating film 7b constituting the second sidewall spacer fill the space between the gate electrode 4a and the drain electrode 6a as described below.

Figure 3B:
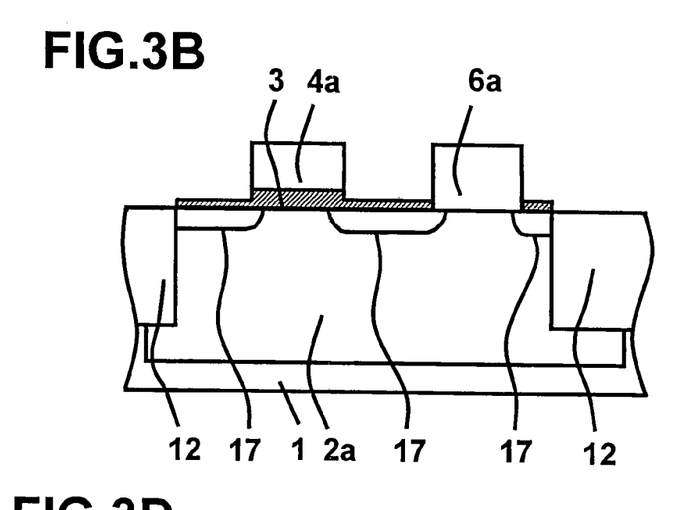

FIG. 3B is an enlarged schematic view showing the principal portion in the step of implanting first impurities as low-concentration conductive impurities into the space between the gate electrode 4a and the drain electrode 6a. FIG. 3B shows low-concentration impurity regions 17 subsequent to FIG. 3A. In the substrate 1, the low-concentration impurity regions 17 have a phosphorus concentration of $1.0 \times 10^{19}$ cm$^{-3}$ and a depth of 50 nm. In this embodiment, the first impurities are phosphorus.

As shown in FIG. 3B, phosphorus is implanted as n-type conductive impurities at a low concentration into the drain region 5a from the space between the gate electrode 4a and the plug 6a using the gate electrode 4a and the drain electrode 6a as a mask to form the low-concentration impurity regions 17.

Figure 3C:
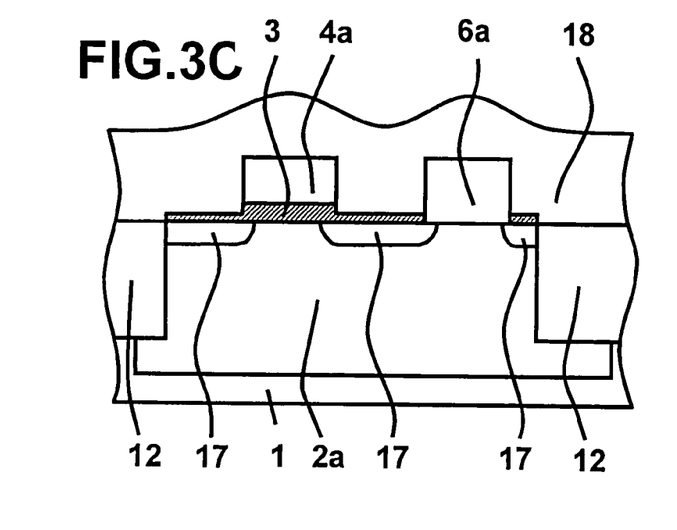
Figure 3D:
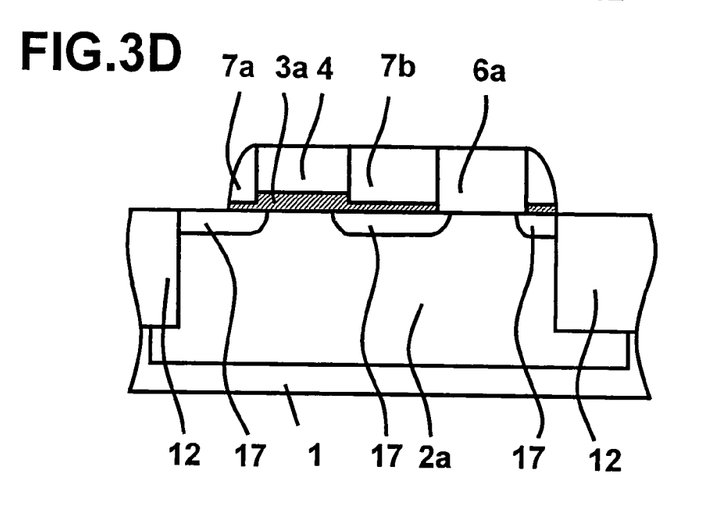

FIGS. 3C and 3D are enlarged schematic views each showing the principal portion in the step forming the insulating film 18 to fill the space. FIG. 3C shows the insulating film 18 in addition to FIG. 3B. The insulating film is composed of, for example, silicon oxide.

As shown in FIG. 3C, the insulating film 18 is thickly deposited on the surfaces of the gate electrode 4a, the plug 6a, and the space therebetween so as to completely fill the space.

FIG. 3D shows the insulating film 7a constituting the first sidewall spacer and the insulating film 7b constituting the second sidewall spacer in addition to FIG. 3C. The insulating films 7a and 7b are composed of, for example, silicon oxide.

As shown in FIG. 3D, anisotropic etching is performed to simultaneously form the insulating film 7a constituting the first sidewall spacer on the sidewall on the source region side of the gate electrode 4a and the insulating film 7b constituting the second sidewall spacer on the sidewall on the drain side of the gate electrode 4a. In this step, the space between the gate electrode 4a and the drain electrode 6a is filled with the insulating film 7b constituting the second sidewall spacer.

Figure 4A:
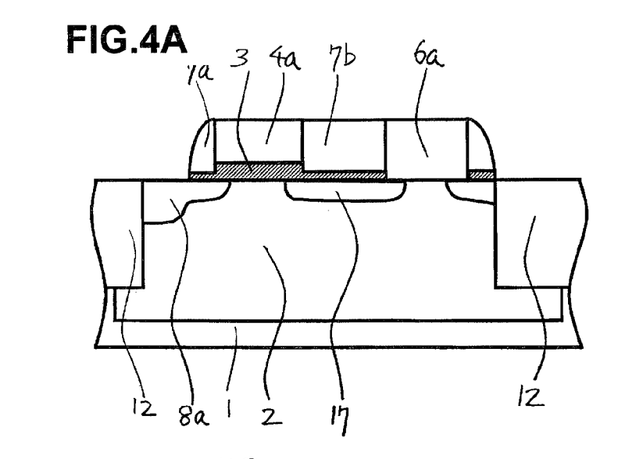
FIGS. 4A to 4C are schematic sectional views each showing a principal portion in a step for manufacturing the high breakdown-voltage semiconductor device according to the first embodiment.

FIG. 4A is an enlarged schematic view showing the principal portion in the step of implanting a high-concentration of conductive impurities as second impurities into the source region, the gate electrode, and the drain electrode. FIG. 4A shows the source region 8a in addition to FIG. 3D. As shown in FIG. 4A, phosphorus ions as conductive impurities at a high concentration are implanted as the second impurities using the gate electrode 4a, the plug 6a, the insulating film 7a constituting the first sidewall spacer, and the insulating film 7b constituting the second sidewall spacer as a mask to form the n-type source region 8a having a phosphorus concentration of, for example, $5.0 \times 10^{20}$ cm$^{-3}$ and a depth of 100 nm.

Figure 4B:
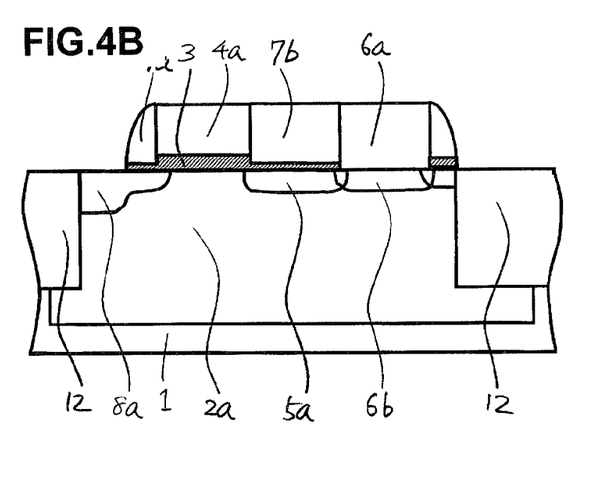

FIG. 4B is an enlarged schematic view showing the principal portion in the step of activating the first or second impurities implanted into the drain electrode 6a and diffusing the first or second impurities from the drain electrode 6a into the substrate by heat treatment. In this step, the impurity diffusion layer 6b connected to the shallow drain region 5a is formed below the drain electrode 6a. FIG. 4B shows the drain region 5a in addition to FIG. 4A. As shown in FIG. 4B, the first or second impurities implanted in the previous step are activated by an activation annealing treatment. At the same time, the first or second impurities diffuse inward from the surface of the substrate 1 to form the impurity diffusion layer 6b.

Figure 4C:
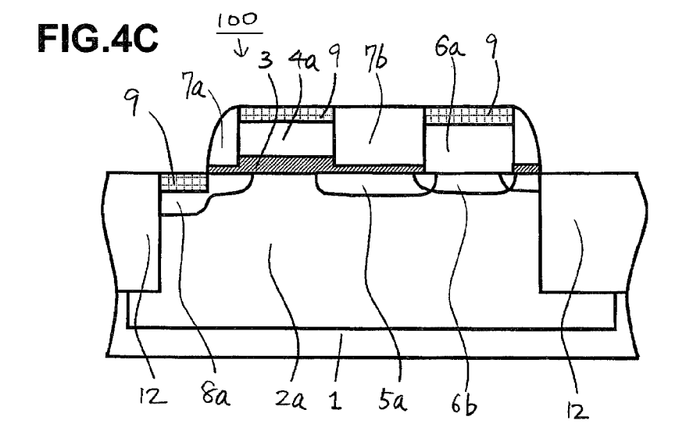

FIG. 4C is an enlarged schematic view showing the principal portion in the step of forming the silicide layer on the surfaces of the source region, the gate electrode, and the drain electrode. FIG. 4C shows the cobalt silicide layer 9 in addition to FIG. 4B.

As shown in FIG. 4C, a metal film, e.g., a cobalt film, is deposited on the surface of the substrate 1, including the surfaces of the source region 8a, the gate electrode 4a, and the drain electrode 6a, followed by heat treatment to form the cobalt silicide layer 9 as a metal silicide on the surfaces of the source region 8a, the gate electrode 4a, and the drain electrode 6a. Then, the unreacted cobalt film is removed, and then the cobalt silicide layer 9 is converted to low-resistance phase cobalt silicide by a second heat treatment.

Then, the steps of forming the contact plugs 20a to 20c shown in FIG. 1A and forming an interlayer insulating film and wiring are performed to complete the high breakdown-voltage semiconductor device 100 according to this embodiment.

Figure 5:
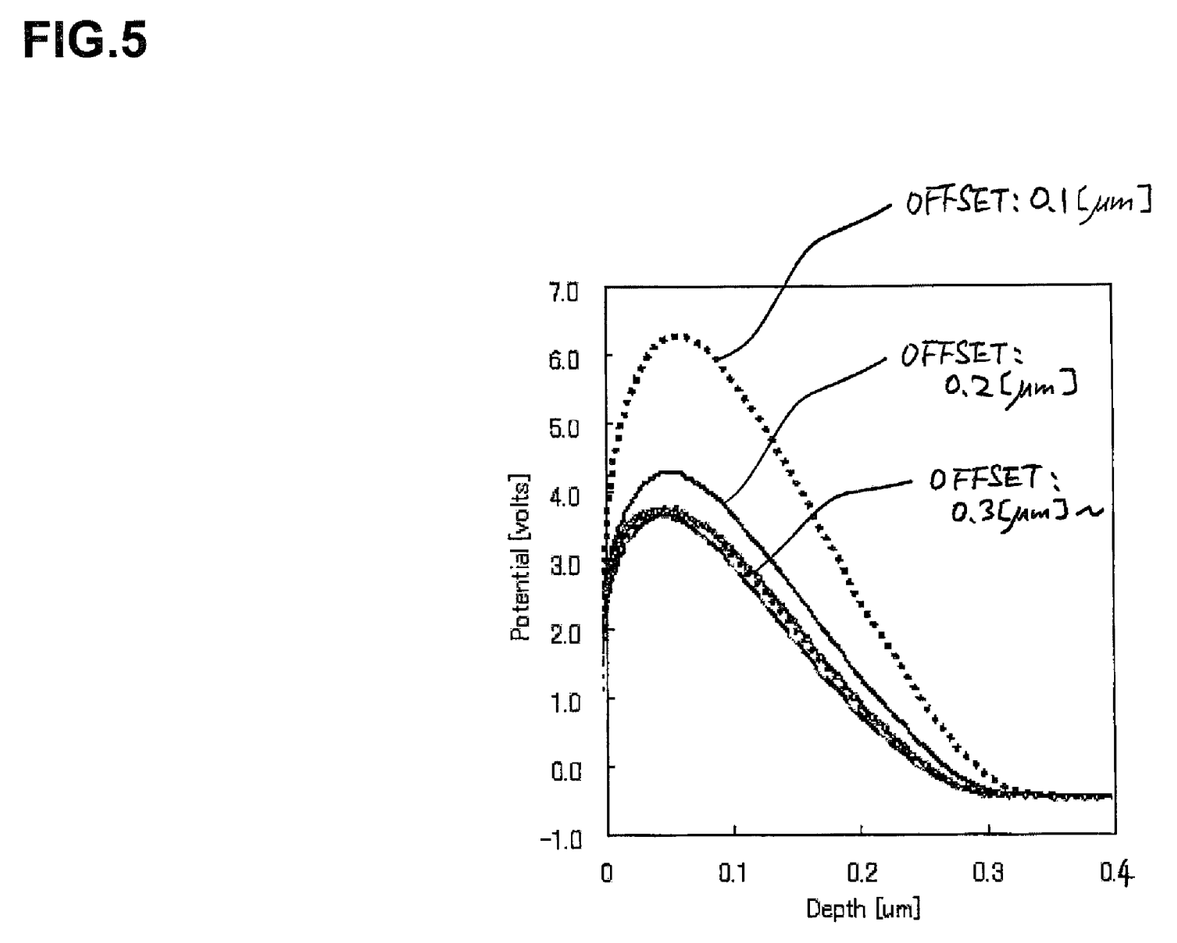
FIG. 5 is a graph showing changes of the voltage between source and drain regions of the high breakdown-voltage semiconductor device according to the first embodiment.

FIG. 5 shows changes of the voltage between the source and drain regions of the high breakdown-voltage semiconductor device according to the first embodiment. In FIG. 5, the depth [μm] of the drain region 5a is shown as abscissa, and the voltage [V] applied to the gate end when a voltage of 10 V is applied between the source 8a and the drain electrode 6a is shown as ordinate. In the figure, OFFSET represents the distance [μm] between the gate electrode 4a and the drain electrode 6a. Further, a dotted line shows changes of the voltage when the distance between the gate electrode 4a and the drain electrode 6a is 0.1 [μm], and a solid line shows changes of the voltage when the distance between the gate electrode 4a and the drain electrode 6a is 0.2 [μm]. The other lines show changes of the voltage when the distance between the gate electrode 4a and the drain electrode 6a is 0.3 [μm] or more.

FIG. 5 shows that when the distance between the gate electrode 4a and the drain electrode 6a is 0.3 [μm] or more, the maximum value of the voltage applied to the gate end is about 3.7 [V]. In a high breakdown-voltage semiconductor device, the length of the LDD region 5a is generally increased for reducing the electric field at the gate end. However, FIG. 5 indicates that the effect of reducing the electric field cannot be obtained even when the distance between the gate electrode 4a and the drain electrode 6a is set to 0.3 [μm] or more. Also, it is desired that the distance between the gate electrode 4a and the drain electrode 6a is such narrow that it is filled with the insulating film 7a constituting the first sidewall spacer and the insulating film 7b constituting the second sidewall spacer.

Further, in the high breakdown-voltage semiconductor device, the distance between the gate electrode 4a and the drain electrode 6a is determined in consideration of not only the optimum value but also on-resistance having a trade-off relation to breakdown voltage. Therefore, the distance between the gate electrode 4a and the drain electrode 6a can be set to 0.2 [μm] or less. In this case, the distance between the gate electrode 4a and the drain electrode 6a can be filled by depositing, to 0.1 μm, the insulating film 7a constituting the first sidewall spacer and the insulating film 7b constituting the second sidewall spacer.

In the above-mentioned structure of the high breakdown-voltage semiconductor device, a LDD region is formed between the gate electrode 4a and the drain electrode 6a, and thus the electric field applied to the boundary between the drain region 5a and the channel region can be reduced. As a result, the breakdown voltage between the drain region 5a and the substrate 1 can be increased.

The impurity diffusion region 6b is a drain region. The drain region shallower than the source region can be formed in a self alignment manner by the step of implanting a low concentration of conductive impurities into the space between the drain electrode 6a and the gate electrode 4a and the step of diffusing the conductive impurities from the drain electrode 6a into the substrate by a heat treatment. Therefore, unlike in a case in which the LDD region is formed using a mask, alignment is unnecessary, thereby improving variations in the characteristics of the semiconductor device and permitting a reduction of the gate length.

In addition, since the drain electrode 6a and the gate electrode 4a are formed by the same step using the mask, an alignment margin necessary for combining a plurality of mask steps become unnecessary when the distance between the drain electrode 6a and the gate electrode 4a is determined. Therefore, the distance between the gate electrode 4a and the drain electrode 6a can be securely set to an optimum value determined by a trade-off relation between the parasitic resistance and electric field reduction in the drain region 5a.

Further, although the high breakdown-voltage semiconductor device described in this embodiment is a n-type semiconductor device, the transistor may be a p-type high breakdown-voltage semiconductor device. In this case, the conductivity type in the above-described n-type high breakdown-voltage semiconductor device may be reversed.

In addition, this embodiment is not limited to the constitution and conditions described in the embodiment, and various changes can be made. For example, the impurity concentrations, depths, thicknesses, gate length, and distance length, which are described in the first embodiment, are only examples, and these values may be appropriately determined according to the required high breakdown voltage and high-frequency characteristics.

Further, the insulating film that fills the space between the gate electrode and the drain electrode serves as a silicide block. Therefore, the insulating film exhibits high compatibility with a CMOS logic process, and thus a high breakdown-voltage transistor can be manufactured without additional steps, thereby realizing integration of a power amplifier using the high breakdown-voltage transistor and a control logic circuit at a low cost.

For example, when the high breakdown-voltage transistor is used for a high-frequency power amplifier, the transistor is frequently mixed with a control CMOS logic circuit. When a RF circuit and a base band circuit are mounted on a chip in future, of course, mixing with CMOS is required. Therefore, the manufacturing method which has high compatibility with a logic CMOS process is preferred.

Second Embodiment

A high breakdown-voltage semiconductor device according to a second embodiment is described in detail with reference to FIGS. 6A and 6B. In the high breakdown-voltage transistor according to the second embodiment, a gate electrode is formed to surround a drain region, and thus the area of the drain region can be decreased, thereby reducing the parasitic capacitance of the drain region.

Figure 6A:
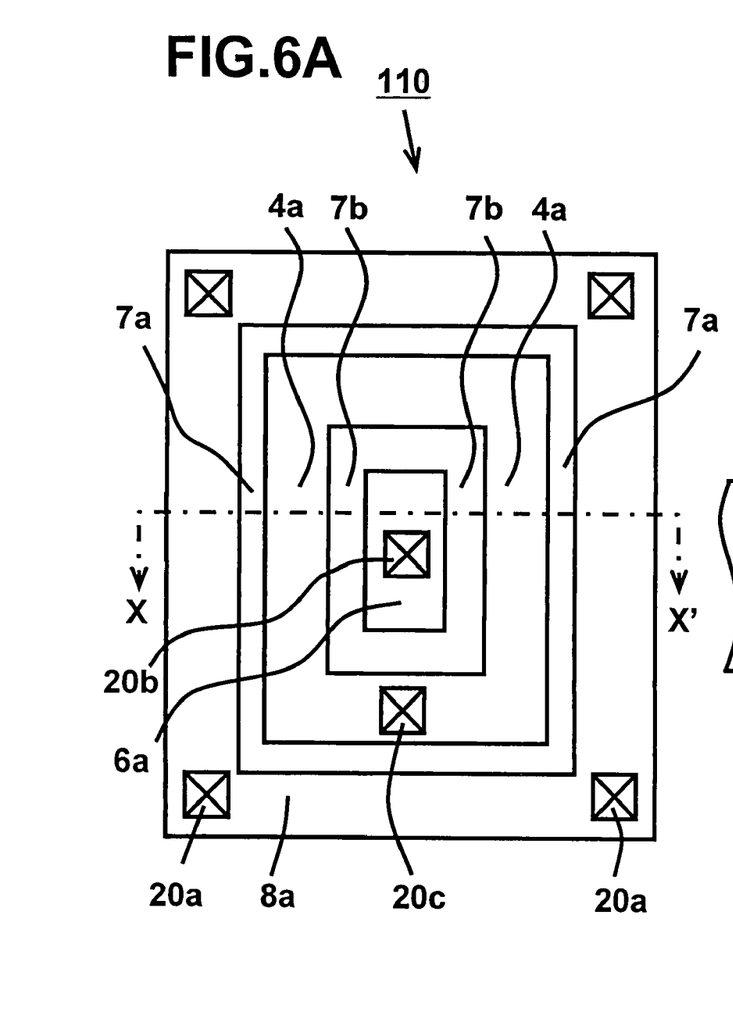
FIG. 6A is a plan view of a high breakdown-voltage semiconductor device according to a second embodiment.

FIG. 6A is a plan view of a high breakdown-voltage semiconductor device according to the second embodiment. FIG. 6A shows a high breakdown-voltage Semiconductor device 110 including a gate electrode 4a, a drain electrode 6a, an insulating film 7a constituting a first sidewall spacer, an insulating film 7b constituting a second sidewall spacer, a source region 8a, contact plugs 20a for connecting wiring to the source region, contact plugs 20b for connecting wiring to the drain electrode, and a contact plug 20c for connecting wiring to the gate electrode 4a. Also, a silicide layer 9 and an interlayer insulating film are formed on the surfaces of the gate electrode 4a, the drain electrode 6a, and the source region 8a. In FIG. 6A, the completely same components as those shown in FIG. 1A are denoted by the same reference numerals. As shown in FIG. 6A, the gate electrode 4a is formed to surround the drain electrode 6a.

Figure 6B:
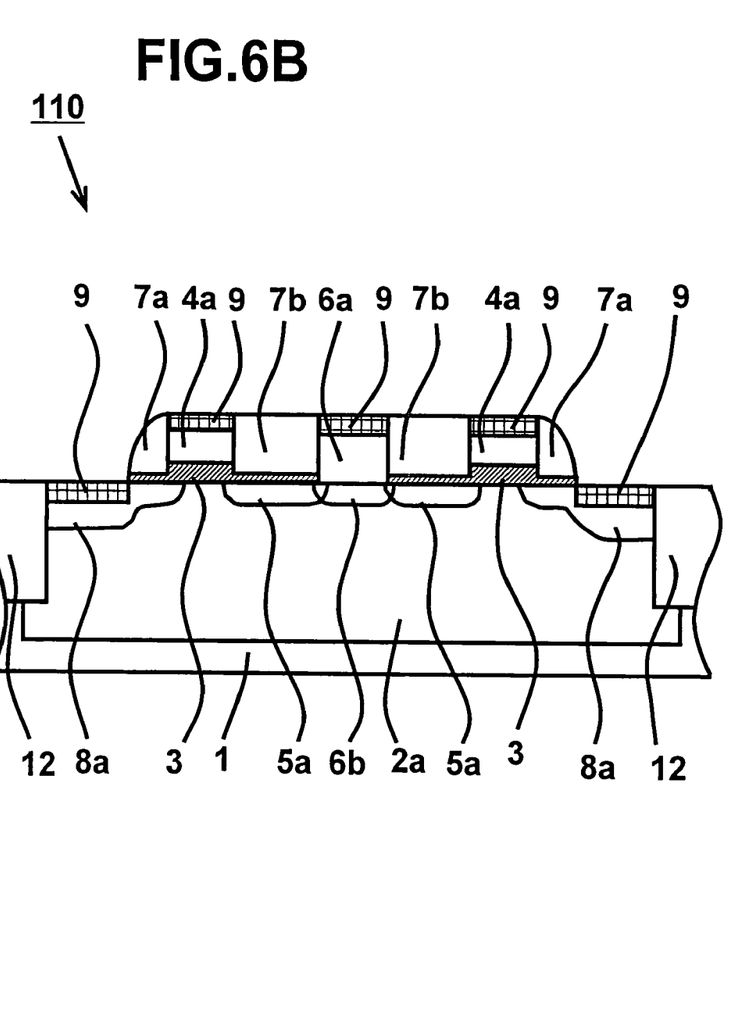
FIG. 6B is a schematic sectional view of a principal portion of the high breakdown-voltage semiconductor device according to the second embodiment.

FIG. 6B is a schematic sectional view of a principal portion of the high breakdown-voltage semiconductor device according to the second embodiment, taken along line X-X' in FIG. 6A. FIG. 6B shows the high breakdown-voltage semiconductor device 110 including a substrate 1, a p-type well region 2, a gate insulating film 3, the gate electrode 4a, a drain region 5a, the drain electrode 6a, an impurity diffusion layer 6b, the insulating film 7a constituting the first sidewall spacer, the insulating film 7b constituting the second sidewall spacer, the source region 8a, the cobalt silicide layer 9, and an element separation region 12. In FIG. 6B, the completely same components as in FIG. 6A are denoted by the same reference numerals.

The high breakdown-voltage semiconductor device according to the second embodiment has the structural characteristic that the gate electrode 4a is formed to surround the drain region 5a and the drain electrode 6a. In this constitution, the number of portions, for example edge region (edges) where an electric field is concentrated between the gate electrode 4a and the drain region 5a is inevitably decreased. Also, the area of the drain region 5a can be decreased, and thus the parasitic capacitance of the drain region can be decreased. As a result, reduction of the electric field in the drain region 5a can be further improved.

Typical examples of application include a high-frequency power amplifier used in a transmission portion of a mobile communication apparatus such has a cellular phone. However, the present embodiment can be used in other applications in which high breakdown voltage and high-frequency characteristics are required.

What is claimed is:

1. A method of manufacturing a semiconductor device, comprising:
    forming a gate insulating film over a surface of a substrate;
    eliminating a portion of the gate insulating film in a region;
    forming a gate electrode over the gate insulating film and a drain electrode on the region;
    implanting first impurities into the substrate using the gate electrode and the drain electrode as a mask;
    forming an insulating film to fill the space between the gate electrode and the drain electrode; and
    implanting second impurities into the substrate to form a source region using the gate electrode, the drain electrode and the insulating film as a mask.

2. The method according to claim 1, further comprising:
    forming an impurity diffusion layer by diffusing the first or second impurities by a first heat treatment.

3. The method according to claim 2, wherein the impurity diffusion layer having a smaller depth than the implanting depth of the second impurities in the substrate.

4. The method according to claim 1, further comprising:
    after forming the insulating film, forming a metal film over the substrate; and
    forming a metal silicide on the surfaces of the source region, the gate electrode, and the drain electrode by a second heat treatment.

5. The method according to claim 1, wherein implanting second impurities in the substrate is implanting the second impunities having a greater depth than the first impurities in the substrate.

6. The method according to claim 1, wherein forming the gate electrode and the drain electrode includes poly silicon.

7. The method according to claim 1, wherein forming the insulating film is depositing the insulating film over the substrate and etching the insulating film over the substrate by anisotropic etching.

* * * * *